US012751148B2

(12) United States Patent
Shin et al.

(10) Patent No.: US 12,751,148 B2
(45) Date of Patent: Sep. 29, 2026

(54) LIGHT EMITTING DISPLAY APPARATUS

(71) Applicant: LG Display Co., Ltd., Seoul (KR)

(72) Inventors: Hyeon-Hoon Shin, Paju-si (KR); Won-Hee Lee, Paju-si (KR)

(73) Assignee: LG Display Co., Ltd., Seoul (KR)

( * ) Notice: Subject to any disclaimer, the term of this patent is extended or adjusted under 35 U.S.C. 154(b) by 471 days.

(21) Appl. No.: 18/357,714

(22) Filed: Jul. 24, 2023

(65) Prior Publication Data

US 2024/0040851 A1 Feb. 1, 2024

(30) Foreign Application Priority Data

Jul. 29, 2022 (KR) ........................ 10-2022-0094560

(51) Int. Cl.
*H10K 59/122* (2023.01)
*H10K 59/35* (2023.01)

(52) U.S. Cl.
CPC ......... *H10K 59/122* (2023.02); *H10K 59/351* (2023.02); *H10K 59/353* (2023.02)

(58) Field of Classification Search
None
See application file for complete search history.

(56) References Cited

U.S. PATENT DOCUMENTS 12,514,076 B2 * 12/2025 Li ........................ H10K 59/131
2021/0391397 A1 12/2021 Koo et al.
2021/0408163 A1 12/2021 Heo et al.
2022/0052135 A1 2/2022 Heo et al.
2022/0285463 A1 * 9/2022 Lee ........................ H10K 59/88
2023/0008148 A1 * 1/2023 Hyun ...................... H10K 59/40
2023/0146971 A1 * 5/2023 Ju ........................ H10K 59/131
257/72

FOREIGN PATENT DOCUMENTS

KR 10-2020-0076278 A 6/2020
KR 10-2021-0079071 A 6/2021
KR 10-2021-0155674 A 12/2021
KR 10-2022-0020166 A 2/2022

OTHER PUBLICATIONS

Ministry of Intellectual Property of Korea, Office Action, Korean Patent Application No. 10-2022-0094560, Feb. 6, 2026, 17 pages.
German Patent and Trade Mark Office, Office Action, German Patent Application No. 102023119888.2, Jul. 28, 2026, 12 pages.

* cited by examiner

*Primary Examiner* — Michelle Mandala
(74) *Attorney, Agent, or Firm* — Fenwick & West LLP

(57) ABSTRACT

A light emitting display apparatus includes a substrate including emission areas and a non-emission area between the emission area; a plurality of subpixels disposed in the emission areas; a first electrode disposed in each of the plurality of subpixels; a bank disposed on the first electrode and in the non-emission area; a spacer disposed on the bank; and at least one protrusion disposed between the spacer and the emission area, wherein the plurality of subpixels surround the spacer, and wherein at least one pair of the subpixels emitting the same color light is symmetrically disposed with respect to the spacer.

28 Claims, 4 Drawing Sheets

LIGHT EMITTING DISPLAY APPARATUS

CROSS-REFERENCE TO RELATED APPLICATION

The present application claims the priority of Republic of Korea Patent Application No. 10-2022-0094560 filed on Jul. 29, 2022, which is herein incorporated by reference in its entirety.

BACKGROUND

Technical Field

The present disclosure relates to a light emitting display apparatus, and specifically, to a light emitting display apparatus being capable of preventing or at least reducing damages on a light emitting element layer due to ion penetration caused by foreign substances or particles. More specifically, the present disclosure relates to a light emitting display apparatus being capable of preventing or at least reducing a black spot defect due to a deterioration of the light emitting element layer and having improved reliability by increasing an ion movement distance.

Description of the Background

Various sizes, various shapes, and various functions are required for recent display devices being capable of displaying various types of information and interacting with users who watch the corresponding information.

Such display devices include a liquid crystal display (LCD) device, an electrophoretic display (EPD) device, and a light emitting diode display (LED) apparatus.

The light emitting display apparatus is a self-emitting display apparatus and does not require a separate light source. As a result, the light emitting display apparatus can be manufactured to be lightweight and thin. In addition, since the light emitting display apparatus is advantageous in power consumption, color reproductivity, response speed, viewing angle, and contrast ratio (CR), the light emitting display apparatus is being studied as a next-generation display.

Although the description will be made on the assumption that the light emitting display apparatus is an organic light emitting display apparatus, the type of a light emitting element layer is not limited thereto.

The light emitting display apparatus displays information on a screen by emitting light from a plurality of pixels including a light emitting element layer having a light emitting layer. The light emitting display apparatus can be divided into an active-matrix type light emitting display apparatus and a passive-matrix type light emitting display apparatus according to a method of driving the pixels.

The active-matrix type light emitting display apparatus displays an image by controlling current flowing through a light emitting diode using a thin film transistor (TFT).

The light emitting display apparatus includes an anode electrode, a light emitting element layer, and a cathode electrode. When voltages are applied to the anode electrode and the cathode electrode, respectively, holes from the anode electrode and electrons from the cathode electrode move to a light emitting layer. When holes and electrons are combined in the light emitting layer, excitons are formed in an excitation process, and light is generated due to energy from the excitons.

In subsequent processes of the light emitting element layer, foreign substances or particles may be generated in the light emitting element layer included in the light emitting display apparatus so that ions presented in the light emitting display apparatus may penetrate into the light emitting element layer. As a result, the light emitting element layer may be deteriorated. Particularly, the above problem is significant at a high temperature condition. In order to provide a high-reliable light emitting display apparatus, various studies have been made to block the movement path of ions penetrating into the light emitting element layer, but solution for blocking the movement path of ions is still insufficient. Accordingly, new solution for blocking the movement path of ions is required.

SUMMARY

The present disclosure is directed to a light emitting display apparatus that substantially obviates one or more of the problems associated with the limitations and disadvantages of the conventional art.

More specifically, the present disclosure is to provide a light emitting display apparatus being capable of preventing or at least reducing penetration of ions.

Additional features and advantages of the present disclosure are set forth in the description which follows, and will be apparent from the description, or evident by practice of the present disclosure. Other advantages of the present disclosure are realized and attained by the features described herein as well as in the appended drawings.

To achieve these and other advantages in accordance with the purpose of the aspects of the present disclosure, as described herein, an embodiment of the present disclosure is a light emitting display apparatus comprising a substrate including a plurality of emission areas and a non-emission area between the plurality of emission area; a plurality of subpixels in the emission areas; a first electrode disposed in a subpixel from the plurality of subpixels; a bank disposed on the first electrode, the bank in the non-emission area; and a spacer on the bank in the non-emission area; and at least one protrusion between the spacer and the plurality of emission area. The plurality of subpixels surround the spacer, and at least one pair of subpixels from the plurality of subpixels that emit a same color of light is symmetrically disposed with respect to the spacer.

In one embodiment, a light emitting display apparatus includes a substrate. The substrate includes a plurality of emission areas and a non-emission area between the plurality of emission areas. The light emitting display apparatus also includes a spacer in the non-emission area; and one or more protrusions that protrude away from the substrate in the non-emission area. The one or more protrusions surrounding the spacer in a plan view of the light emitting display apparatus. The light emitting display apparatus also includes a plurality of subpixels in the plurality of emission areas. The plurality of subpixels surround the spacer and the one or more protrusions in the plan view.

In one embodiments, a light emitting display apparatus includes a substrate including an emission area and a non-emission area, and a light emitting element in the emission area. The light emitting element includes a first electrode, a light emitting layer on the first electrode, and a second electrode. The light emitting layer is configured to emit light. The light emitting display apparatus also includes a transistor connected to the first electrode of the light emitting element, and a bank in the non-emission area and on a portion of the first electrode that extends to the non-emission area. The bank includes a first protrusion having a first height, and one or more second protrusions having a second height that is less than the first height. The one or more second protrusions are between the first protrusion and the emission area.

It is to be understood that both the foregoing general description and the following detailed description are exemplary and explanatory and are intended to further explain the present disclosure as claimed.

BRIEF DESCRIPTION OF THE DRAWINGS

The accompanying drawings, which are included to provide a further understanding of the present disclosure and are incorporated in and constitute a part of this specification, illustrate aspects of the present disclosure and together with the description serve to explain the principles of the present disclosure.

In the drawings.

DETAILED DESCRIPTION

Figure 1:
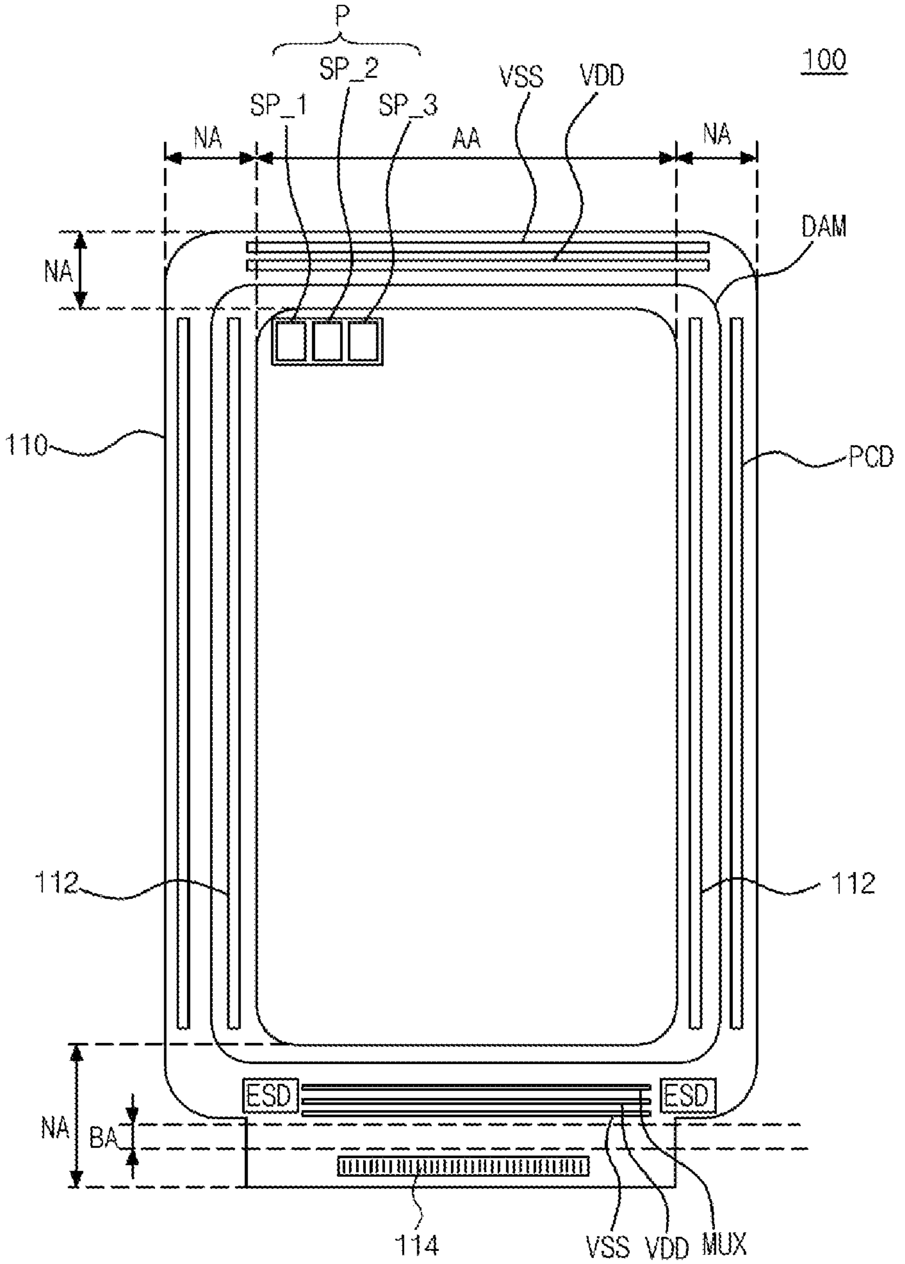
FIG. 1 is a schematic plan view of a light emitting display apparatus according to an embodiment of the present disclosure.

Advantages and features of the present disclosure and methods of achieving them will be apparent with reference to the aspects described below in detail with the accompanying drawings. However, the present disclosure is not limited to the aspects disclosed below, but can be realized in a variety of different forms, and only these aspects allow the disclosure of the present disclosure to be complete. The present disclosure is provided to fully inform the scope of the disclosure to the skilled in the art of the present disclosure.

The shapes, sizes, proportions, angles, numbers, and the like disclosed in the drawings for explaining the aspects of the present disclosure are illustrative, and the present disclosure is not limited to the illustrated matters. The same reference numerals refer to the same elements throughout the specification. In addition, in describing the present disclosure, if it is determined that a detailed description of the related known technology unnecessarily obscures the subject matter of the present disclosure, the detailed description thereof can be omitted. When 'including', 'having', 'comprising', and the like are used in this specification, other parts may be added unless 'only' is used. When a component is expressed in the singular, cases including the plural are included unless specific statement is described.

In construing an element, the element is construed as including an error or tolerance range although there is no explicit description of such an error or tolerance range.

In describing a position relationship, for example, when a position relation between two parts is described as, for example, "on," "over," "under," and "next," one or more other parts may be disposed between the two parts unless a more limiting term, such as "just" or "direct(ly)" is used.

In describing a time relationship, for example, when the temporal order is described as, for example, "after," "subsequent," "next," and "before," a case that is not continuous may be included unless a more limiting term, such as "just," "immediate(ly)," or "direct(ly)" is used.

It will be understood that, although the terms "first," "second," etc. may be used herein to describe various elements, these elements should not be limited by these terms. These terms are only used to distinguish one element from another. For example, a first element could be termed a second element, and, similarly, a second element could be termed a first element, without departing from the scope of the present disclosure.

The terms "first", "second", "A," "B," "(a)," "(b)," etc. may be used to describe elements.

These terms are only used to distinguish an element from another element, and the nature, sequence, order, or number of the corresponding element is not limited by the term. When an element is described as being "connected," "combined," or "coupled" to another element, the element can be not only directly connected, combined or coupled to another element, but also indirectly connected, combined or coupled to another element with other element being "interposed" therebetween unless specifically stated otherwise.

"At least one" should be understood to include all combinations of one or more of the associated elements. For example, "at least one of the first, second, and third elements" means not only one of the first, second, or third elements but also a combination of all elements of two or more of the first, second, and third elements.

In the present disclosure, "apparatus" may include a display device such as a liquid crystal module (LCM) and an organic light emitting module (OLED Module) including a display panel and a driving unit for driving the display panel. In addition, "apparatus" may include a complete product or final product including LCM and OLED module, such as a notebook computer, a television, a computer monitor, an equipment apparatus, e.g., an automotive apparatus or other form of a vehicle, a mobile electronic apparatus, e.g., a smart phone or an electronic pad. These final products may be referred to as a set device or a set apparatus.

Accordingly, the apparatus in the present disclosure may include the display device in a narrow definition, such as LCM, OLED module, or the like, and the set device, which is an application product or end-user device including LCM, OLED module, or the like.

In some cases, LCM and OLED module including the display panel and the driving unit may be referred to as "display device" in a narrow definition, and electronic apparatus as a final product including LCM and OLED module may be referred to as a "set device". For example, the display device in the narrow definition may include the display panel and a source PCB as a control unit for driving the display panel, and the set device may further include a set PCB as a set control unit being connected to the source PCB and controlling the entire set device.

The display panel used in the present disclosure includes all type of display panels, e.g., a liquid crystal display panel, an organic light emitting diode (OLED) display panel, an electroluminescent display panel, or the like. However, aspects of the present disclosure are not limited thereto.

For example, the display panel may be a display panel capable of generating sound by being vibrated by a vibration device according to an embodiment of the present disclosure. A display panel applied to a display device according to an aspect of the present disclosure is not limited to a shape or size of the display panel.

Features of various aspects of the present disclosure may be partially or overall coupled to or combined with each other, and may be variously inter-operated with each other and driven technically as those skilled in the art can sufficiently understand. The aspects of the present disclosure may be carried out independently from each other, or may be carried out together in co-dependent relationship.

The scales of the elements shown in the drawings have different scales from actual ones for convenience of explanation, so they are not limited to the scales shown in the drawings.

Reference will now be made in detail to some of the examples and various aspects, which are illustrated in the accompanying drawings.

FIG. 1 is a schematic plan view of a light emitting display apparatus according to an aspect of the present disclosure.

Referring to FIG. 1, the light emitting display apparatus 100 of the present disclosure may include various additional elements for generating various signals or driving a plurality of subpixels SP in the active area AA. For example, one or more driving circuits for controlling a display panel may be included in the light emitting display apparatus 100. The driving circuit for controlling (or driving) the subpixels SP_1, SP_2 and SP_3 may include a gate driver, data signal lines, a multiplexer (MUX), an electro static discharge (ESD) circuit, a high potential voltage line (VDD), a low potential voltage line (VSS), an inverter circuit, and the like. The light emitting display apparatus 100 may also include additional elements other than functions for driving the subpixels SP. For example, the light emitting display apparatus 100 may include additional elements providing a touch sensing function, a user authentication function (e.g., fingerprint recognition), a multi-level pressure sensing function, and a tactile feedback function. The aforementioned additional elements may be located in a non-active area NA or an external circuit connected to the connection interface.

A substrate 110 may include an active area AA and a non-active area NA. The plurality of pixels P are arranged in the display area AA of the substrate 110 so that the active area AA may be an image-display area. The non-active area NA of the substrate 110 may be a non-image-display area. For example, the non-active area NA may be a bezel area, but it is not limited thereto. The non-active area NA may be adjacent to the active area AA and may be disposed at outer side than the active area AA. The non-active area NA may be disposed to surround an entire or a part of the active area AA. Namely, the non-active area NA may be disposed to wholly or partially surround the active area AA. Moreover, the non-active area NA may be an area, where the subpixels SP_1, SP_2 and SP_3 are not presented, but it is not limited thereto.

The pixel P in the active area AA may include the plurality of subpixels SP_1, SP_2 and SP_3. Each of the subpixels SP_1, SP_2 and SP_3 is a unit for emitting light. The plurality of subpixels SP_1, SP_2 and SP_3 may be a red subpixel, a green subpixel and a blue subpixel. The pixel P may further include a white subpixel. However, a number of subpixels in the pixel P and color of the subpixels are not limited thereto.

Each of the subpixels SP_1, SP_2 and SP_3 includes an organic light emitting diode and a driving circuit. For example, a display element for displaying images and a driving circuit for driving (or controlling) the display element may be disposed in each of the subpixels SP_1, SP_2 and SP_3.

Each of the subpixels SP_1, SP_2 and SP_3 may include a plurality of transistors, one or more capacitors and a plurality of lines. For example, each of the subpixels SP_1, SP_2 and SP_3 may include two transistors and one capacitor, and this subpixel structure may be referred to as a "2T1C" structure. Each of the subpixels SP_1, SP_2 and SP_3 may have a structure of "3T1C", "4T1C", "5T1C", "6T1C", "7T1C", "3T2C", "4T2C", "5T2C", "6T2C", "7T2C", "8T2C", or the like.

Various lines, a driving circuit, or the like for driving the subpixels SP_1, SP_2 and SP_3 in the active area AA are disposed in the non-active area NA. For example, various ICs and the driving circuits such as the gate driver or the data driver may be disposed in the non-active area NA.

In FIG. 1, the non-active area NA surrounds the active area AA having a rectangular shape. However, a shape of the active area AA and a shape or arrangement of non-active area NA, which is adjacent to the active area AA, are not limited to the shape or arrangement shown in FIG. 1. The active area AA and the non-active area NA may have shapes suitable for the design of an electronic apparatus in which the light emitting display apparatus 100 is mounted. In the case of a display apparatus of a wearable apparatus by a user, the active area AA and the non-active area NA may have a circular shape like a general wrist watch, and the concepts of the embodiments of the present disclosure can also be applied to a free-form display apparatus applicable to a vehicle dashboard. Exemplary shapes of the active area AA may be pentagonal, hexagonal, octagonal, circular, or elliptical, but are not limited thereto.

A bending area BA may be included in a part of the non-active area NA. The bending area BA may be positioned between the active area AA and a pad portion 114 in the non-active area NA. The bending area BA may be an area in which a connection line is formed.

The bending area BA may be an area in which a portion of the substrate 110 is bent in order to dispose the pad portion 114 and an external module, which is bonded to the pad portion 114, on a rear side of the substrate 110. For example, as the bending area BA is bent toward the rear side of the substrate 110, the external module, which is bonded to the pad portion 114 of the substrate 110, moves toward the rear surface of the substrate 110 so that the external modules may not be recognized when viewed from the top.

In addition, as the bending area BA is bent, the size of the non-active area NA viewed from above the substrate 110 is reduced so that a narrow bezel is realized. In the present disclosure, it is illustrated that the bending area BA is present in the non-active area NA, but is not limited thereto. For example, the bending area BA may be positioned in the active area AA. Since the active area AA can be bent in various directions, the bending area BA positioned in the active area AA can provide an effect of the present disclosure.

The pad portion 114 is disposed in the non-active area NA. The pad portion 114 is a metal pattern to which an external module, e.g., a flexible printed circuit board (FPCB) or a chip on film (COF), is bonded. The pad portion 114 is shown to be disposed at a side of the substrate 110, but shape or arrangement of the pad portion 114 are not limited thereto.

The gate driver 112 for providing a gate signal to the TFT may be disposed at a portion of the non-active area NA. The gate driver 112 includes various gate driving circuits, and the gate driving circuits may be directly formed on the substrate 110. In this case, the gate driver 112 may be referred to as a gate-in-panel (GIP) structure.

The gate driver 112 may be positioned between the active area AA and a dam "DAM" in the non-active area NA.

The high potential voltage line VDD, the low potential voltage line VSS, the multiplexer MUX, the ESD circuit and the connection line portion may be disposed between the active area AA and the pad portion 114 in the non-active area NA.

In a portion of the non-active area NA, the high potential voltage line VDD, the low potential voltage line VSS, the multiplexer MUX and the ESD circuit may be disposed between the active area AA and the bending area BA.

The connection line portion may be disposed in the non-active area NA. For example, the connection line portion may be disposed in the being area BA of the non-active area NA.

The connection line portion may be configured to transfer a signal (voltage) from an external module, which is bonded to the pad portion 114, to the active area AA or a circuit portion such as the gate driver 112. For example, various signals for driving the gate driver 112 and various signals, such as data signals, high-potential voltages, and low-potential voltages, may be transferred through the connection line portion.

The dam "DAM" may be disposed to surround an entire or a part of the active area AA. The dam "DAM" is adjacent to the active area AA and is positioned at an outer side than the active area AA.

The dam "DAM" may be disposed to be along a periphery of the active area AA to control flow of an organic material being a material of a second encapsulation layer of an encapsulation layer, which is disposed on the light emitting element layer. One or more dam "DAM" may be formed.

The dam "DAM" may be disposed between the active area AA and each of the high potential voltage line VDD, the low potential voltage line VSS, the multiplexer MUX and the ESD circuit.

In a portion of the non-active area NA of the substrate 110, a panel crack detector PCD may be disposed.

The panel crack detector PCD may be disposed between an end of the substrate 110 and the dam "DAM". Alternatively, the panel crack detector PCD may be disposed under the dam "DAM" to partially or wholly overlap the dam "DAM".

Figure 2:
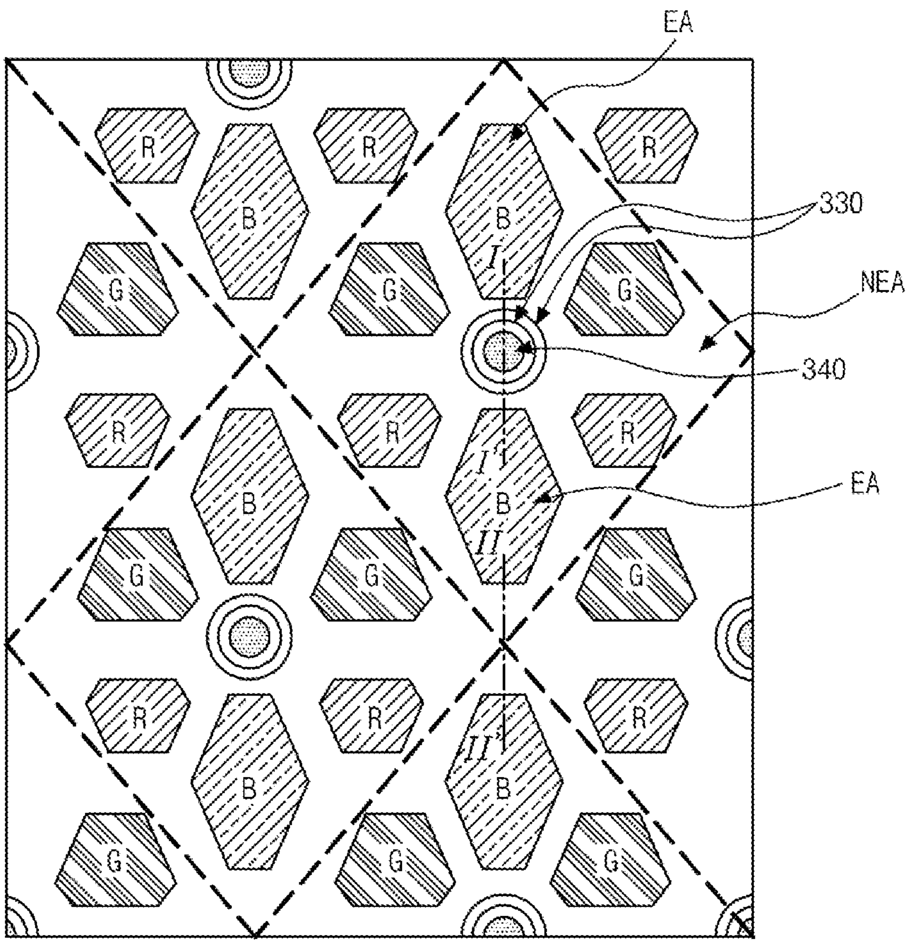
FIG. 2 is a view showing an arrangement of a spacer and a subpixel in a light emitting display apparatus according to an embodiment of the present disclosure.

FIG. 2 is a view showing an arrangement of a spacer and a subpixel in a light emitting display apparatus according to an aspect of the present disclosure.

Referring to FIG. 2, the active area AA of the substrate 110 includes an emission area EA and a non-emission area NEA disposed between adjacent emission areas EA. The emission areas EA may be disposed to be spaced apart from each other. The non-emission area NEA may be disposed to surround the emission area EA.

Figure 3:
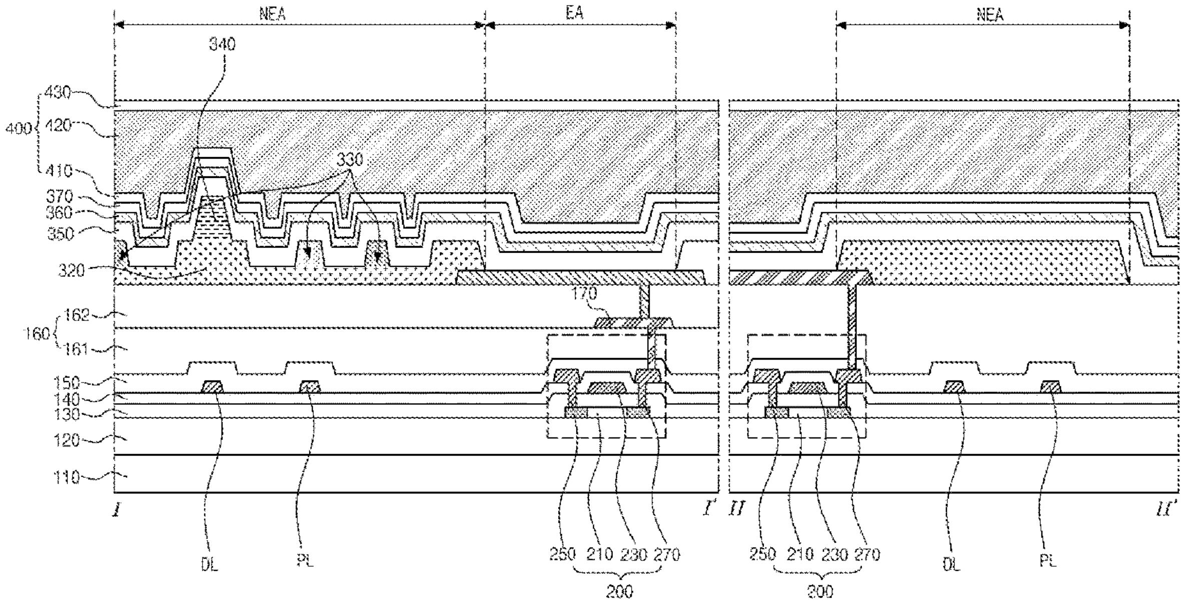
FIG. 3 is a schematic cross-sectional view of a light emitting display apparatus according to an embodiment of the present disclosure.
Figure 4:
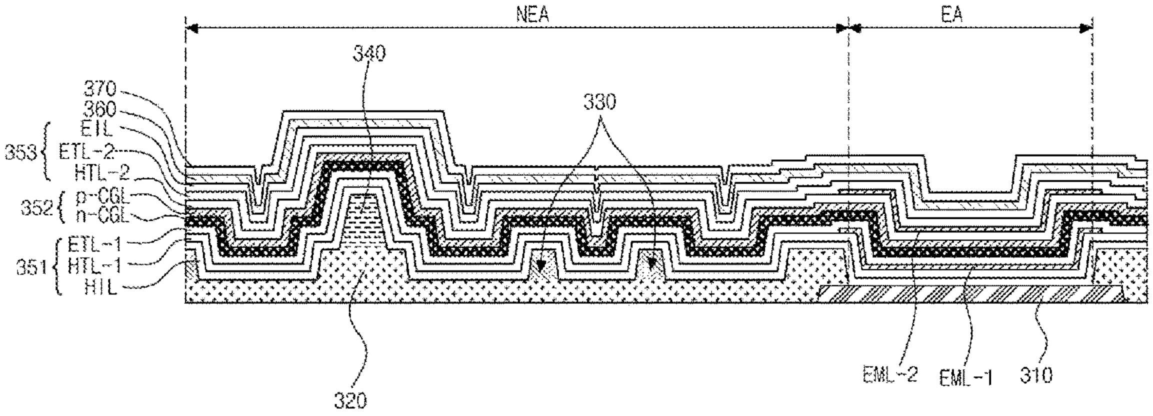
FIG. 4 is an enlarged-plan view of a light emitting element layer shown in FIG. 3 according to an embodiment of the present disclosure.
Figure 5:
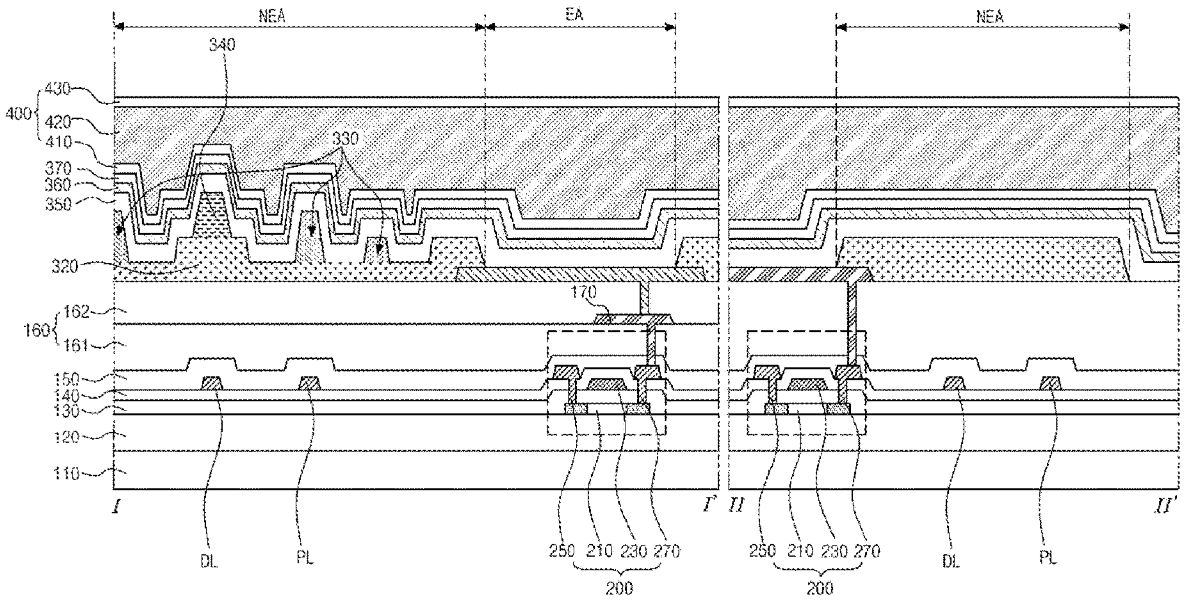
FIG. 5 is a schematic cross-sectional view of a light emitting display apparatus according to another embodiment of the present disclosure.

The emission area EA is an area in which the light from the light emitting layer is emitted. Referring to FIGS. 3 to 5, the emission area EA may be an area in which a bank 320 is not presented.

The non-emission area NEA is an area in which the light from the light emitting layer is not emitted. Referring to FIGS. 3 to 5, the non-emission area NEA may be an area in which the bank 320 is presented.

The plurality of subpixels SP_1, SP_2 and SP_3 emitting different color light may be positioned in the emission area EA. The plurality of subpixels SP_1, SP_2 and SP_3 may be a red subpixel R, a green subpixel G and a blue subpixel B, respectively. Although not shown, a white subpixel may be further included in the emission area EA.

In FIG. 2, each of the subpixels R, G and B may have a specific shape and may be arranged in a specific pattern. However, shape of the subpixels R, G and B and arrangement of the subpixels R, G and B are not limited thereto. For example, each of the subpixels R, G and B may have a rectangular shape, a pentagonal shape, a hexagonal shape, an octagonal shape, a circular shape, elliptical shape, or the like.

The blue subpixel B may have an area being greater than each of the red subpixel R and the green subpixel G. The blue subpixel B and the red and green subpixels R and G, which are disposed at a side (e.g., a left side) of the blue subpixel B, may constitute one pixel.

The blue subpixel B may be disposed over other subpixels. For example, the blue subpixel B may overlap at least a portion of the red subpixel R and the green subpixel G.

A distance between adjacent two of the blue subpixels B may be greater than a distance between adjacent two of the subpixels emitting different color light. For example, a distance between adjacent two of the blue subpixels B may be greater than each of a distance between the blue subpixel B and the red subpixel R, a distance between the blue subpixel B and the green subpixel G and a distance between the red subpixel R and the green subpixel G.

A spacer 340 is disposed to have a pre-determined distance with the subpixels R, G and B. For example, the spacer 340 may be surrounded by the subpixels R, G and B with the pre-determined distance therefrom. The spacer and protrusions prevent impurities in a portion of the light emitting element in the non-emission area from propagating to the portion of the light emitting element in the emissions areas due to the increased length of the light emitting element that results from the spacer and the protrusions. In one embodiment shown in FIG. 2, six subpixels may surround one spacer.

At least one pair of the subpixels emitting the same color light may be symmetrically disposed with respect to the spacer 340. For example, the blue subpixels B may be disposed to face each other with the spacer 340 therebetween. In FIG. 2, two red subpixels R are disposed at both sides of one blue subpixel B, and two green subpixels G are disposed at both sides of another blue subpixel B. Alternatively, one red subpixel R and one green subpixel G may be disposed at both sides of the blue subpixel B so that two red subpixels R, two green subpixels G and two blue subpixels B may be symmetrically disposed with respect to the spacer 340, respectively.

The spacer 340 may be disposed at a center of at least one pair of the subpixels emitting the same color light.

A protrusion 330 having a pre-determined distance from the spacer 340 and surrounding the spacer 340 may be further disposed.

The protrusion 330 may be continuously formed to have a closed curve shape (or a looped curve shape) or may be discontinuously formed to have a spacing portion.

The spacer 340 can buffer an empty space between the substrate 110, on which the light emitting element layer 350 is formed, and the upper substrate, thereby minimizing or at least reducing damage to the light emitting display apparatus 100 from impact from the outside.

In addition, the spacer 340 can protect the light emitting element layer 350. For example, when the light emitting element layer 350 is formed using a fine metal mask (FMM), the fine metal mask may sag during processing due to its weight. However, since the spacer 340 is disposed and the fine metal mask and the spacer 340 contact each other, the deformation of the bank 320 or the damages on the bank 320, which may be caused by the direct contact between the fine metal mask and the bank 320, can be prevented or at least reduced.

On the other hand, during the deposition process of the light emitting element layer 350, foreign substances or particles remaining in the chamber may partially remain on the fine metal mask, and some foreign substances or particles may be transferred to the substrate in the process of contacting the fine metal mask with the spacer. Therefore, foreign substances or particles can be mainly observed on the upper surface of the spacer. A crack may be generated in the light emitting element layer or the encapsulation layer by the foreign substances or particles on the spacer, and ions remaining in the light emitting display apparatus may penetrate into the light emitting element layer through the crack. For example, impurities such as F-ions remaining in the second encapsulation layer can move to the light emitting element layer through the crack so that the light emitting element layer may deteriorate. A black spot problem may be generated in the subpixel where the ions penetrate. In particular, since the movement speed of impurities increases at a high temperature, deterioration of the light emitting element layer is accelerated, and there are problems in the brightness and the lifespan in the light emitting display apparatus.

However, in the light emitting display apparatus of the present disclosure, since the protrusion 330 wholly or partially surrounds the spacer 340, the movement of ions to the light emitting element layer through the crack, which is generated by foreign substances or particles on the upper surface of the spacer 340 can be prevented or at least reduced. Accordingly, the deterioration of the light emitting element layer can be prevented or at least reduced.

In the light emitting display apparatus according to the embodiment of the present disclosure, a moving path of the ions is lengthened by curves formed by protrusion, the occurrence of black spots is blocked so that the reliability and the display quality can be improved.

Hereinafter, referring to FIGS. 3 and 4, the light emitting display apparatus including the protrusion 330 is explained in more detail.

FIG. 3 is a schematic cross-sectional view of a light emitting display apparatus according to an aspect of the present disclosure, and FIG. 4 is an enlarged-plan view of a light emitting element layer shown in FIG. 3.

FIG. 3 is a cross-sectional view taken along the line I-I' and the line II-II'.

Referring to FIG. 3, the light emitting display apparatus 100 according to the present disclosure may include the bank 320, the protrusion 330 and the spacer 340.

The substrate 110 can support various elements of the light emitting display apparatus 100. The substrate 110 may be formed of glass or a plastic material having flexibility.

For example, the substrate may be formed of at least one of polyimide (PI), polymethylmethacrylate (PMMA), polyethylene terephthalate (PET), Polyethersulfone and polycarbonate, but it is not limited thereto.

When the substrate 110 is formed of PI, the substrate 110 may include two layers of PI. In this case, the substrate 110 may further include an organic layer between two layers of PI.

The structure including elements and functional layers, e.g., a switching TFT, a driving TFT connected to the switching TFT, the organic light emitting diode connected to the driving TFT, a passivation layer, and the like, disposed on or over the substrate 110 may be referred to the substrate 110, but it is not limited thereto.

A buffer layer 120 may be disposed on an entire surface of the substrate 110.

The buffer layer 120 may be formed of an inorganic insulating material, e.g., silicon nitride (SiNx) or silicon oxide (SiOx) or an organic insulating material, but it is not limited thereto.

The buffer layer 120 may have a single layered structure of silicon nitride or silicon oxide or a multi-layered structure of silicon nitride and silicon oxide. When the buffer layer 120 has the multi-layered structure, a layer of silicon oxide and a layer of silicon nitride may be alternately stacked.

The buffer layer 120 may be omitted depending on the type and material of the substrate 110 and the structure and type of the thin film transistor.

A TFT 200 may be disposed on the buffer layer 120. The TFT 200 may include a semiconductor pattern, a gate electrode, a source electrode and a drain electrode.

For convenience of description, only a driving TFT among various TFTs that may be included in the light emitting display apparatus 100 is illustrated, but other TFTs such as a switching TFT may also be included in the light emitting display apparatus 100. In addition, for convenience of description, the TFT having a top-gate structure is shown, but it is not limited thereto. For example, the TFT may have a bottom-gate structure.

The semiconductor pattern 210 of the TFT 200 may be disposed on the buffer layer 120.

The semiconductor pattern 210 may be formed of a poly-crystalline semiconductor. For example, the poly-crystalline semiconductor may be low temperature poly-silicon (LTPS) having high mobility, but it is not limited thereto. When the semiconductor pattern 210 may be formed of a poly-crystalline semiconductor, energy power consumption is low and reliability is excellent.

Alternatively, the semiconductor pattern 210 may be formed of an oxide semiconductor. For example, the semiconductor pattern 210 may be formed of one of indium-gallium-zinc-oxide (IGZO), indium-zinc-oxide (IZO), indium-gallium-tin-oxide (IGTO) and indium-gallium-oxide (IGO), but it is not limited. When the semiconductor pattern 210 may be formed of an oxide semiconductor, the semiconductor pattern 210 has an excellent effect of blocking leakage current, and thus, a change in luminance of a sub-pixel can be minimized or at least reduced during low-speed driving.

When the semiconductor pattern 210 is formed of a polycrystalline semiconductor or an oxide semiconductor, a portion of the semiconductor pattern 210 may have a conductive region.

The semiconductor pattern 210 may be formed of amorphous silicon (a-Si) or various organic semiconductor materials such as pentacene, but it is not limited thereto.

A first insulating layer 130 may be disposed on the semiconductor pattern 210.

The first insulating layer 130 is disposed between the semiconductor pattern 210 and the gate electrode 230 to insulate the semiconductor pattern 210 and the gate electrode 230.

The first insulating layer 130 may be formed of an inorganic insulating material, such as silicon nitride (SiNx) or silicon oxide (SiOx), or an organic insulating material, but it is not limited thereto.

The first insulating layer 130 may include a hole to electrically connect each of the source electrode 250 and the drain electrode 270 to the semiconductor pattern 210.

The gate electrode 230 of the TFT 200 may be disposed on the first insulating layer 130.

The gate electrode 230 may be disposed to overlap the semiconductor pattern 210.

The gate electrode 230 may be formed of one of molybdenum (Mo), copper (Cu), titanium (Ti), aluminum (Al), chromium (Cr), gold (Au), nickel (Ni), neodymium (Nd), or tungsten (W), gold (Au), transparent conductive oxide (TCO) and their alloys and may have a single-layered structure or a multi-layered structure, but it is not limited thereto.

A second insulating layer 140 may be disposed on the gate electrode 230.

The second insulating layer 140 may be disposed between the gate electrode 230 and each of the source electrode 250 and the drain electrode 270 to insulate the gate electrode 230 and each of the source electrode 250 and the drain electrode 270.

The second insulating layer 140 may be formed of an inorganic insulating material, such as silicon nitride (SiNx) or silicon oxide (SiOx), or an organic insulating material, but it is not limited thereto.

The second insulating layer 140 may include a hole to electrically connect each of the source electrode 250 and the drain electrode 270 to the semiconductor pattern 210.

The source electrode 250 and the drain electrode 270 may be disposed on the second insulating layer 140.

The source electrode 250 and the drain electrode 270 may be electrically connected to the semiconductor pattern 210 through the hole in the first and second insulating layers 130 and 140, respectively.

Each of the source electrode 250 and the drain electrode 270 may be formed of one of molybdenum (Mo), copper (Cu), titanium (Ti), aluminum (Al), chromium (Cr), gold (Au), nickel (Ni), neodymium (Nd), or tungsten (W), gold (Au), transparent conductive oxide (TCO) and their alloys and may have a single-layered structure or a multi-layered structure, but it is not limited thereto.

For example, each of the source electrode 250 and the drain electrode 270 may have a triple-layered structure of Ti/Al/Ti, but it is not limited thereto.

A data line DL and/or a power line PL may be further disposed on the second insulating layer 140 and between adjacent subpixels. The data line DL and the power line PL may be formed of the same material, the same structure and the same fabricating method as the source and drain electrodes 250 and 270.

The power line PL may be parallel to one of the gate line and the data line and may cross the other one of the gate line and the data line.

The power line PL may be formed in a mesh pattern in which metal lines having a small line width cross each other. The shape of the mesh pattern may be a rectangle, pentagon, hexagon, circle, ellipse, and the like, but it is not limited thereto.

The power line PL may also be formed together when a connection electrode 170 to be described later is disposed.

A passivation layer 150 may be disposed on the source and drain electrodes 250 and 270.

The passivation layer 150 may protect the TFT 200. The passivation layer 150 may be formed of an inorganic insulating material, such as silicon nitride (SiNx) or silicon oxide (SiOx), or an organic insulating material, but it is not limited thereto.

The passivation layer 150 may include a hole for electrically connecting the TFT 200 and an anode electrode 310.

The passivation layer 150 may be omitted depending on a structure or type of the TFT 200.

A planarization layer 160 may be disposed on the passivation layer 150 or the TFT 200.

The planarization layer 160 may protect the TFT 200 and may alleviate or planarize step differences caused by various patterns.

The planarization layer 160 may be formed of an organic insulating material. For example, the planarization layer 160 may be formed of at least one of benzocyclobutene (BCB), acrylic resin, epoxy resin, phenolic resin, polyamide resin and polyimide resin, but it is not limited thereto.

The planarization layer 160 may have a single-layered structure or a multi-layered structure depending on an arrangement of electrodes.

As the light emitting display apparatus 100 evolves to a higher resolution, a number of signal lines is increased. As a result, it is difficult to arrange all the lines on one layer while ensuring a minimum interval, so additional layers may be required. This additional layer frees up wiring layout, making wire/electrode layout design easier. In addition, when a dielectric material is used as a planarization layer having a multi-layered structure, the planarization layer 160 between metal layers may be used for forming capacitance.

When the planarization layer 160 has a double-layered structure, the planarization layer 160 may include a first planarization layer 161 and a second planarization layer 162.

For example, a hole may be formed in the first planarization layer 161, and a connection electrode 170 may be disposed in the hole. The second planarization layer 162 having holes may be disposed on the first planarization layer 161 and the connection electrode 170. The anode electrode 310 may be disposed in the hole of the second planarization layer 162. Accordingly, the thin film transistor 200 and the anode electrode 310 may be electrically connected through the connection electrode 170.

An end (a portion) of the connection electrode 170 may be connected to the TFT 200, and the other end (the other portion) of the connection electrode 170 may be connected to the anode electrode 310.

The connection electrode 170 may be formed of one of molybdenum (Mo), copper (Cu), titanium (Ti), aluminum (Al), chromium (Cr), gold (Au), nickel (Ni), neodymium (Nd), or tungsten (W), gold (Au), transparent conductive oxide (TCO) and their alloys and may have a single-layered structure or a multi-layered structure, but it is not limited thereto.

When the connection electrode 170 is disposed, the power line PL may be formed of the same material, the same structure and the same fabricating method as the connection electrode 170.

The connection electrode 170 may be omitted depending on a structure or type of the light emitting display apparatus.

The anode electrode 310 may be disposed on the planarization layer 160. The anode electrode 310 may be positioned in the emitting area EA and at least a portion of the non-emission area NEA.

When the light emitting display apparatus 100 is a top emission type, the anode electrode 310 is a reflective electrode that reflects light and may be disposed using an opaque conductive material. The anode electrode 310 may be formed of at least one of silver (Ag), aluminum (Al), gold (Au), molybdenum (Mo), tungsten (W), chromium (Cr), lead (Pd), copper (Cu) and their alloys. For example, the anode electrode 310 may have a triple-layered structure of Ag/Pd/Cu, but it is not limited thereto. Alternatively, the anode electrode 310 may further include a layer of a transparent conductive material having a high work function, such as indium-tin-oxide (ITO).

When the light emitting display apparatus 100 is a bottom emission type, the anode electrode 310 may be disposed using a transparent conductive material that transmits light. For example, the anode electrode 310 may be formed of at least one of indium tin oxide (ITO) and indium zinc oxide (IZO).

A bank 320 may be disposed on the anode electrode 310 and the planarization layer 160.

The bank 320 can define a plurality of sub-pixels (SP), minimize or at least reduce light blurring, and prevent or at least reduce color mixing from occurring at various viewing angles.

The bank 320 may define (or distinguish) the emission area EA and the non-emission area NEA, and the bank 320 may be disposed in the non-emission area NEA.

The bank 320 may include a bank hole exposing the anode electrode 310.

The bank 320 may be formed of at least one of an inorganic insulating material, such as silicon nitride (SiNx) or silicon oxide (SiOx), an organic insulating material, such as benzocyclobutene (BCB), acrylic resin, epoxy resin, phenolic resin, or polyamide resin or polyimide resin, and photosensitizer including a black (or black) pigment, but it is not limited thereto.

The bank 320 may be transparent, black, or colored.

The bank 320 may be disposed to cover the end of the anode electrode 310.

At least one spacer 340 may be disposed on the bank 320. The spacer 340 may be formed of the same material as the bank 320 and may be formed simultaneously with the bank 320 or may be formed in a separate process.

A height of the spacer 340 may be greater than that of the bank 320, and a thickness of the spacer 340 may be greater than that of the bank 320. For example, a thickness of the spacer 340 may be 1 um to 2 um.

At least one protrusion 330 between the spacer 340 and an end of the bank 320 may be disposed. In other words, at least one protrusion 330 may be disposed between the emission area EA and the spacer 340.

The protrusion 330 may be formed by removing a portion of the bank 320. A height of a portion of the bank 320, from which a portion is removed, may be smaller than that of the bank 320.

The protrusion 330 may be integrated with the bank 320 as one-body.

The protrusion 330 may be formed of the same material as the bank 320 and the spacer 340. The protrusion 330 may have a single-layered structure or a multi-layered structure.

Since the protrusion 330 is disposed on the bank 320, a top surface of the bank 320 may be uneven.

Referring to FIGS. 2 and 3, the spacer 340 and the protrusion 330 are presented between a first blue subpixel B and a second blue subpixel B, which are adjacent to each other, but the spacer 340 and the protrusion 330 are not presented between the second blue subpixel B and a third blue subpixel B, which are adjacent to each other. Accordingly, a portion of the bank 320 between the first and second blue subpixels has an uneven top surface due to the protrusion 330 protruding from the top surface of the portion of the bank, and another portion between the second and third blue subpixels has a flat top surface due to the lack of the protrusion between the second and third blue subpixels. In other words, the bank 320 has a concave portion between an emission area EA and the spacer 340, and the protrusion 330 is disposed in the concave portion.

When a height from the substrate 110 to the protrusion 330 is equal to or greater than a height from the substrate 110 to the spacer 340, the fine metal mask (FMM) and the protrusion 330 come into contact during the deposition process of the light emitting element layer 350. Therefore, a problem of foreign substances or particles occurring on the protrusion 330 may occur. However, in the light emitting display apparatus of the present disclosure, the height from the substrate 110 to the protrusion 330 is smaller than the height from the substrate 110 to the spacer 340. As a result, the above problem can be prevented or at least reduced.

Compared to the cross-section in the line II-II' of FIG. 3, since a part of the bank is removed and the protrusion 330 is disposed, the length of components such as the light emitting element layer disposed on the top surface of the bank 320 can be increased. Due to the uneven shape formed by the protrusion 330, the traveling distance of ions to light emitting element layer is increased so that the problem of deterioration of the light emitting element layer by penetration of the foreign substance or particle can be prevented or reduced. In addition, it is possible to improve reliability and display quality by preventing or reducing a likelihood of black dots from occurring in the corresponding sub-pixel SP due to degradation of the light emitting element layer.

The light emitting element layer 350 may be disposed on the bank 320, the spacer 340 and the protrusion 330.

The light emitting element layer 350 may be disposed according to a curve shape formed by the bank 320, the spacer 340 and the protrusion 330.

The light emitting element layer 350 may include a plurality of emitting parts. For example, the light emitting element layer 350 may include a first emitting part 351, a second emitting part 353 and a charge generation layer 352 between the first and second emitting parts 351 and 353. The detailed structure of the light emitting element layer 350 will be described with FIG. 4.

A cathode electrode 360 may be disposed on the light emitting element layer 350. The cathode electrode 360 supplies electrons to the light emitting element layer 350 and may be formed of a conductive material having a low work function.

When the light emitting display apparatus 100 is a top emission type, the cathode electrode 360 may be disposed using a transparent conductive material that transmits light. For example, the cathode electrode 360 may be formed of at least one of indium tin oxide (ITO) and indium zinc oxide (IZO), but it is not limited thereto.

In addition, the cathode electrode 360 may be disposed using a translucent conductive material that transmits light. For example, the cathode electrode 360 may be formed of at least one of alloys such as LiF/Al, CsF/Al, Mg:Ag, Ca/Ag, Ca:Ag, LiF/Mg:Ag, LiF/Ca/Ag, and LiF/Ca:Ag.

When the light emitting display apparatus 100 is a bottom emission type, the cathode electrode 360 is a reflective electrode that reflects light and may be disposed using an opaque conductive material. For example, the cathode electrode 360 may be formed of at least one of silver (Ag), aluminum (Al), gold (Au), molybdenum (Mo), tungsten (W), chromium (Cr) and their alloys.

A capping layer (CPL) 370 may be disposed on the cathode electrode 360.

The capping layer 370 protects the cathode electrode 360 and increases the light extraction effect of the light emitting element layer. The capping layer 370 may have a single-layered structure or a multi-layered structure.

The capping layer 370 may be omitted depending on the structure and type of the light emitting display apparatus 100.

The encapsulation layer 400 may be disposed on the cathode electrode 360 or the capping layer 370. The encapsulation layer 400 may protect the anode electrode 310, the light emitting element layer 350, and the cathode electrode 360 from external moisture, oxygen, foreign substances or particles. For example, penetration of oxygen and moisture from the outside may be prevented or at least reduced, so that oxidation of the light emitting material and the electrode material is prevented or at least reduced.

The encapsulation layer 400 may be made of a transparent material to transmit light emitted from the light emitting layer.

The encapsulation layer 400 may include a first encapsulation layer 410, a second encapsulation layer 420 and a third encapsulation layer 430 that block penetration of moisture or oxygen. The first encapsulation layer 410, the second encapsulation layer 420 and the third encapsulation layer 430 may be alternately stacked. Namely, the third encapsulation layer 430 may be disposed over the first encapsulation layer 410, and the second encapsulation layer 420 may be disposed between the first and third encapsulation layers 410 and 430.

The first encapsulation layer 410 and the third encapsulation layer 430 may be formed of at least one inorganic material selected from silicon nitride (SiNx), silicon oxide (SiOx), and aluminum oxide (AlyOz), but it is not limited thereto. The first encapsulation layer 410 and the third encapsulation layer 430 may be formed using a vacuum deposition method such as chemical vapor deposition (CVD) or atomic layer deposition (ALD), but it is not limited thereto.

Each of the first encapsulation layer 410 and the third encapsulation layer 430 may be formed of at least two or more layers. For example, the first encapsulation layer 410 may have a triple-layered structure of SiOx/SiNx/SiOx, but it is not limited thereto. Alternatively, the first encapsulation layer 410 may have a quadruple-layered structure of SiOx/SiNx/SiOx/SiOx, but it is not limited thereto.

The second encapsulation layer 420 may cover foreign substances or particles that may occur in the manufacturing process. In addition, the second encapsulation layer 420 may planarize the surface of the first encapsulation layer 410. For example, the second encapsulation layer 420 may be a particle cover layer, but a function of the second encapsulation layer 420 is not limited the term.

The second encapsulation layer 420 may be formed of an organic material, for example, a polymer such as silicon oxycarbon (SiOC, or silicon oxycarbide) epoxy, polyimide, polyethylene, or acrylate, but it is not limited thereto.

The second encapsulation layer 420 may be formed of a heat-curable material or a photo-curable material.

Referring to FIG. 4, which is an enlarged cross-sectional view, the light emitting element layer will be described in more detail.

The light emitting element layer 350 according to an embodiment of the present disclosure may include a plurality of emitting parts.

For convenience of explanation, only two emitting parts are shown, but two or more emitting parts and one or more charge generation layers between the two or more emitting parts may be included.

Since the spacer 340, the bank 320 and the protrusion 330 are disposed between adjacent subpixels, the plurality of emitting parts 351 and 353 and the charge generation layer 352 may be disposed according to the uneven top formed by the spacer 340, the bank 320 and the protrusion 330. Accordingly, a length of a common element of the plurality of emitting parts 351 and 353 and the charge generation layer 352 in adjacent subpixel is increased so that a traveling distance of electrons from one subpixel to another subpixel is also increased. As a result, a horizontal leakage current can be blocked. Namely, when the light emitting display apparatus 100 is driven, electrons formed inside the light emitting element layer may be prevented or at least reduced from moving to neighboring pixels.

In addition, horizontal leakage current can be blocked even if a distance between adjacent subpixels is reduced. In particular, a visibility defect, in which adjacent subpixels emit light at a low grayscale, can be solved, and color reproducibility can be improved.

The first emitting part 351 may include a hole injection layer HIL, a first hole transporting layer HTL-1, a first light emitting layer EML-1 and a first electron transporting layer ETL-1.

The second emitting part 353 may include a second hole transporting layer HTL-2, a second light emitting layer EML-2, a second electron transporting layer ETL-2 and an electron injection layer EIL.

The charge generation layer 352 may include an n-type charge generation layer n-CGL for injecting an electron to the first emitting part 351 and a p-type charge generation layer p-CGL for injecting a hole to the second emitting part 353.

The elements of the light emitting element layer other than the light emitting layer may be disposed over an entire surface of a display area AA of the substrate 110 or at least a portion of the display area AA of the substrate 110.

For example, the hole injection layer HIL, the first hole transporting layer HTL-1, the first electron transporting layer ETL-1, the second hole transporting layer HTL-2, the second electron transporting layer ETL-2, the electron injection layer EIL, the n-type charge generation layer n-CGL and the p-type charge generation layer p-CGL may be disposed over an entire surface of a display area AA of the substrate 110.

Each of the light emitting layers EML-1 and EML-2 may be disposed to correspond to each subpixel. Namely, each of the light emitting layers EML-1 and EML-2 may have an island shape in each subpixel. For example, each of the light emitting layers EML-1 and EML-2 may be disposed in the bank hole and at least a portion of an end of the bank 320.

The hole injection layer HIL is formed to efficiently inject a hole. The hole injection layer may be formed of at least one selected from the group comprising HATCN (1,4,5,8,9,11-hexaazatriphenylene-hexanitrile), CuPc (copper phthalocyanine), PEDOT (poly(3,4)-ethylenedioxythiophene), PANI (polyaniline) and NPD (N,N-dinaphthyl-N,N'-diphenylbenzidine), but it is not limited thereto.

The first and second hole transporting layers HTL-1 and HTL-2 is formed to efficiently transfer a hole. Each of first and second hole transporting layers HTL-1 and HTL-2 may be formed of at least one selected from the group comprising NPD (N,N-dinaphthyl-N,N'-diphenylbenzidine), TPD (N,N'-bis-(3-methylphenyl)-N,N'-bis-(phenyl)-benzidine), spiro-TAD (2,2',7,7'-Tetrakis(N,N-diphenylamino)-2,7-diamino-9,9-spirobifluorene) and MTDATA (4,4',4"-tris(N-3-methylphenyl-N-phenyl-amino)-triphenylamine), but it is not limited thereto.

The first and second electron transporting layers ETL-1 and ETL-2 is formed to efficiently transfer an electron. Each of first and second electron transporting layers ETL-1 and ETL-2 may be formed of at least one selected from the group comprising Alq3 (tris(8-hydroxyquinolino)aluminum), PBD (2-(4-biphenylyl)-5-(4-tert-butylpheny)-1,3,4oxadiazole), TAZ (3-(4-biphenyl)-4-phenyl-5-tert-butylphenyl-1,2,4-triazole), spiro-PBD, BAlq (bis(8-hydroxy-2-methylquinoline)-(4-phenylphenoxy)aluminum) and SAlq, but it is not limited thereto.

The electron injection layer EIL is formed to efficiently inject an electron. The electron injection layer EIL may be formed of at least one selected from the group comprising Alq3, PBD, TAZ, spiro-PBD, BAlq and SAlq, but it is not limited thereto. A material of the electron injection layer EIL and a material of the second electron transporting layer ETL-2 may be same or different.

Each of the first and second light emitting layers EML-1 and EML-2 are disposed in the bank hole and may overlap at least a portion of the bank 320. The first and second light emitting layers EML-1 and EML-2 in one subpixel and the first and second light emitting layers EML-1 and EML-2 in adjacent subpixel are spaced apart from each other, respectively. For example, each of the first and second light emitting layers EML-1 and EML-2 may be deposited in each subpixel by using the fine metal mask (FMM).

The first light emitting layer EML-1 and the second light emitting layer EML-2 may overlap. The first and second light emitting layers EML-1 and EM1-2 may emit the same color light. For example, the first and second light emitting layers EML-1 and EM1-2 may emit light having the same wavelength range.

Each of the first and second light emitting layers EML-1 and EM1-2 may include a light emitting material emitting one of red, green and blue colors, and the light emitting material may be a phosphorescent material or a fluorescent material.

For example, each of the first and second light emitting layers EML-1 and EM1-2 in a red subpixel R may include a host material being CBP (carbazole biphenyl) or mCP(1, 3-bis(carbazol-9-yl) and a phosphorescent material as a dopant being at least one selected from the group comprising PIQIr(acac) (bis(1-phenylisoquinoline) acetylacetonate iridium), PQIr(acac) (bis(1-phenylquinoline) acetylacetonate iridium), PQIr (tris(1-phenylquinoline) iridium) and PtOEP (octaethylporphyrin platinum). Alternatively, the dopant may be a fluorescent material being Alq3 (tris(8-hydroxyquinolino)aluminum), but it is not limited thereto.

For example, each of the first and second light emitting layers EML-1 and EM1-2 in a green subpixel G may include a host material being CBP or mCBP and an iridium complex, e.g., Ir(ppy)3 (fac tris(2-phenylpyridine)iridium) as a dopant. Alternatively, the dopant may be a fluorescent material being PBD:Eu(DBM)3(Phen) or perylene, but it is not limited thereto.

For example, each of the first and second light emitting layers EML-1 and EM1-2 in a blue subpixel B may include a host material being CBP or mCBP and a phosphorescent material as a dopant being (4,6-F2ppy)2Irpic. Alternatively, the dopant may be a fluorescent material being one of spiro-DPVBi, 2,2',7,7'-tetrakis(biphenyl-4-yl)-9,9'-spirobifluorene (spiro-6P), distrylbenzene (DSB), distrylarylene (DSA), PFO-based polymer and PPV-based polymer, but it is not limited thereto.

Each of the first and second light emitting layers EML-1 and EML-2 may further include an auxiliary light emitting layer. For example, the auxiliary light emitting layer may be disposed under or over each of the first and second light emitting layers EML-1 and EML-2. The auxiliary light emitting layer may emit the same color light as the first and second light emitting layers EML-1 and EML-2 or different color light from the first and second light emitting layers EML-1 and EML-2.

The n-type charge generation layer n-CGL may be formed of at least one of an alkali metal, an organic material, which has a function of injecting an electron, and their compound. For example, the n-type charge generation layer n-CGL may be formed of an n-type material including an anthracene derivative doped with lithium (Li) or cesium (Cs), but it is not limited thereto.

The p-type charge generation layer p-CGL may be formed of an organic material used for the hole injection layer. For example, the p-type charge generation layer CGL may be formed of a p-type material being HATCN or F4-TCNQ and may have a single-layered structure. However, it is not limited thereto.

Elements included in the first emitting part 351, the second emitting part 353 and the charge generation layer 352 may be formed in two or more or may be omitted.

FIG. 5 is a schematic cross-sectional view of a light emitting display apparatus according to another aspect of the present disclosure.

The light emitting display apparatus in FIG. 5 is substantially the same as the light emitting display apparatus in FIG. 3 except for the protrusions 330, and thus duplicate descriptions are omitted.

The light emitting display apparatus in FIG. 5 includes a plurality of protrusions 330, and the plurality of protrusions 330 have a difference in a height. Namely, the plurality of protrusions 330 includes a first protrusion and a second protrusion, and the first and second protrusions have different heights from the substrate 110.

A height of at least one protrusion 330 from the substrate 110 may be smaller than that of the spacer 340 from the substrate 110.

A height of one protrusion 330 from the substrate 110 may be equal to that of the bank 320 from the substrate 110, and a height of another one protrusion 330 from the substrate 110 may be greater than that of the bank 320 from the substrate 110.

The bank 320 may have an uneven top surface due to the protrusions 330 having different heights. Since the protrusion 330 is formed by removing a part of the bank 320, a length of an element, e.g., the light emitting element layer, disposed on the bank 320 is increased.

Due to the uneven shape formed by the protrusion 330, the traveling distance of ions to light emitting element layer is increased so that the problem of deterioration of the light emitting element layer by penetration of the foreign substance or particle can be prevented or at least reduced. In addition, it is possible to improve reliability and display quality by preventing or reducing a likelihood of black dots from occurring in the corresponding sub-pixel SP due to degradation of the light emitting element layer.

The light emitting display apparatus according to an embodiment of the present disclosure may be illustrated below.

The light emitting display apparatus according to an embodiment of the present disclosure may comprises a substrate including emission areas and a non-emission area between the emission area; a plurality of subpixels disposed in the emission areas; a first electrode disposed in each of the plurality of subpixels; a bank disposed on the first electrode and in the non-emission area; a spacer disposed on the bank; and at least one protrusion disposed between the spacer and the emission area, wherein the plurality of subpixels surround the spacer, and wherein at least one pair of the subpixels emitting the same color light is symmetrically disposed with respect to the spacer.

In the light emitting display apparatus according to the present disclosure, the at least one protrusion may surround the spacer.

In the light emitting display apparatus according to the present disclosure, the at least one protrusion may include the same material as at least one of the bank and the spacer.

In the light emitting display apparatus according to the present disclosure, the at least one protrusion may be integrated with the bank.

In the light emitting display apparatus according to the present disclosure, at least one of the bank and the spacer may be transparent, black or colored.

In the light emitting display apparatus according to the present disclosure, a height of the at least one protrusion from the substrate may be smaller than a height of the spacer from the substrate.

In the light emitting display apparatus according to the present disclosure, the height of the at least one protrusion from the substrate may be equal to a height of the bank from the substrate.

In the light emitting display apparatus according to the present disclosure, the height of the at least one protrusion from the substrate may be greater than a height of the bank from the substrate.

In the light emitting display apparatus according to the present disclosure, the spacer may be disposed at a center of the at least one pair of the subpixels.

In the light emitting display apparatus according to the present disclosure, the plurality of subpixels may include six or more subpixels.

The light emitting display apparatus according to the present disclosure may further comprises: a light emitting element layer disposed on the first electrode, the bank, the at least one protrusion and the spacer and including a plurality of emitting parts and a charge generation layer between the plurality of emitting parts; and a second electrode disposed on the light emitting element layer.

In the light emitting display apparatus according to the present disclosure, each of the plurality of emitting parts may include a light emitting layer emitting the same color light.

The light emitting display apparatus according to the present disclosure may further comprises: an encapsulation layer on the second electrode, wherein the encapsulation layer includes first, second and third encapsulation layers.

In the light emitting display apparatus according to the present disclosure, each of the first and third encapsulation layers may include an inorganic material, and the second encapsulation layer may include an organic material.

In the light emitting display apparatus according to the present disclosure, the first encapsulation layer may include at least three layers.

The light emitting display apparatus according to the present disclosure further comprises: a data line and a power line disposed under the bank or the spacer.

In the light emitting display apparatus according to the present disclosure, at least one of the data line and the power line may overlap with the at least one protrusion or the spacer.

In the light emitting display apparatus according to the present disclosure, the bank between a first blue subpixel of the plurality of subpixels and a second blue subpixel of the plurality of subpixels may have an uneven top surface, and the bank between the second blue subpixel and a third blue subpixel of the plurality of subpixels may have a flat top surface.

In the light emitting display apparatus according to the present disclosure, the at least one protrusion may include a first protrusion and a second protrusion, and the first and second protrusions may have the same height from the substrate.

In the light emitting display apparatus according to the present disclosure, the at least one protrusion may include a first protrusion and a second protrusion, and the first and second protrusions may have different heights from the substrate.

It will be apparent to those skilled in the art that various modifications and variations can be made in the aspects of the present disclosure without departing from the technical idea or scope of the present disclosure. Thus, it is intended that the modifications and variations cover this disclosure provided they come within the scope of the appended claims and their equivalents.

What is claimed is:

1. A light emitting display apparatus, comprising:

a substrate including a plurality of emission areas and a non-emission area between the plurality of emission areas;

a plurality of subpixels in the plurality of emission areas;

a first electrode in a subpixel from the plurality of subpixels;

a bank on the first electrode, the bank in the non-emission area;

a spacer on the bank in the non-emission area; and at least one protrusion between the spacer and the plurality of emission areas, wherein the plurality of subpixels surround the spacer, wherein at least one pair of subpixels from the plurality of subpixels that emit a same color of light are symmetrically disposed with respect to the spacer, wherein the at least one protrusion continuously surrounds the spacer in a closed curve shape in plan view.

2. The light emitting display apparatus according to claim 1, wherein the at least one protrusion surrounds the spacer in a plan view of the light emitting display apparatus.

3. The light emitting display apparatus according to claim 1, wherein the at least one protrusion includes a same material as at least one of the bank or the spacer.

4. The light emitting display apparatus according to claim 1, wherein the at least one protrusion is integrated with the bank.

5. The light emitting display apparatus according to claim 1, wherein at least one of the bank or the spacer is transparent, black, or colored.

6. The light emitting display apparatus according to claim 1, wherein a height of the at least one protrusion from the substrate is less than a height of the spacer from the substrate.

7. The light emitting display apparatus according to claim 6, wherein the height of the at least one protrusion from the substrate is equal to a height of the bank from the substrate.

8. The light emitting display apparatus according to claim 6, wherein the height of the at least one protrusion from the substrate is greater than a height of the bank from the substrate.

9. The light emitting display apparatus according to claim 1, wherein the spacer is at a center of the plurality of subpixels in a plan view of the light emitting display apparatus.

10. The light emitting display apparatus according to claim 1, wherein the plurality of subpixels include six or more subpixels.

11. The light emitting display apparatus according to claim 1, further comprising:

a light emitting element layer on the first electrode, the bank, the at least one protrusion, and the spacer, the light emitting element layer including a plurality of emitting parts and a charge generation layer between the plurality of emitting parts; and a second electrode on the light emitting element layer.

12. The light emitting display apparatus according to claim 11, wherein each of the plurality of emitting parts includes a light emitting layer emitting a same color of light.

13. The light emitting display apparatus according to claim 11, further comprising:

an encapsulation layer on the second electrode, wherein the encapsulation layer includes a first encapsulation layer, a second encapsulation layer, and a third encapsulation layer.

14. The light emitting display apparatus according to claim 13, wherein each of the first encapsulation layer and third encapsulation layer includes an inorganic material, and the second encapsulation layer includes an organic material.

15. The light emitting display apparatus according to claim 1, further comprising:

a data line and a power line under the bank or the spacer, wherein at least one of the data line and the power line overlap the at least one protrusion or the spacer.

16. The light emitting display apparatus according to claim 1, wherein the at least one protrusion protrudes from a top surface of a portion of the bank between a first blue subpixel of the plurality of subpixels and a second blue subpixel of the plurality of subpixels, and the bank between the second blue subpixel and a third blue subpixel of the plurality of subpixels lacks a protrusion.

17. The light emitting display apparatus according to claim 1, wherein the at least one protrusion includes a first protrusion and a second protrusion, and the first protrusion and second protrusion have a same height from the substrate.

18. The light emitting display apparatus according to claim 1, wherein the at least one protrusion includes a first protrusion having a first height from the substrate and a second protrusion having a second height from the substrate that is different from the first height.

19. A light emitting display apparatus, comprising:

a substrate including a plurality of emission areas and a non-emission area between the plurality of emission areas;

a spacer in the non-emission area;

one or more protrusions that protrude away from the substrate in the non-emission area, the one or more protrusions surrounding the spacer in a plan view of the light emitting display apparatus; and a plurality of subpixels in the plurality of emission areas, the plurality of subpixels surrounding the spacer and the one or more protrusions in the plan view, wherein the one or more protrusions continuously surround the spacer in a closed curve shape in the plan view.

20. The light emitting display apparatus of claim 19, wherein the plurality of subpixels comprise a plurality of pairs of subpixels where each pair of subpixels emit light of a same color, and each pair of subpixels is symmetrically disposed on the substrate with respect to the spacer.

21. The light emitting display apparatus of claim 20, wherein the plurality of subpixels comprise a pair of red subpixels that emit red light, a pair of green subpixels that emit green light, and a pair of blue subpixels that emit blue light.

22. The light emitting display apparatus of claim 21, wherein each red subpixel is between a green pixel and a blue pixel in the plan view, each green pixel is between a red pixel and a blue pixel in the plan view, and each blue pixel is between two red pixels or two green pixels in the plan view.

23. The light emitting display apparatus of claim 19, wherein the spacer has a first height, and the one or more protrusions have a second height that is less than the first height.

24. A light emitting display apparatus, comprising:

a substrate including an emission area and a non-emission area;

a light emitting element in the emission area, the light emitting element including a first electrode, a light emitting layer on the first electrode, and a second electrode, the light emitting layer configured to emit light;

a transistor connected to the first electrode of the light emitting element;

a bank in the non-emission area and on a portion of the first electrode that extends to the non-emission area, the bank having a first protrusion having a first height and one or more second protrusions having a second height that is less than the first height, the one or more second protrusions between the first protrusion and the emission area, wherein the one or more second protrusions continuously surrounds at least the first protrusion in a closed curve shape in plan view.

25. The light emitting display apparatus of claim 24, where the light emitting layer and the second electrode overlap the first protrusion and the one or more second protrusions, and the first electrode is non-overlapping with the one or more second protrusions.

26. The light emitting display apparatus of claim 24, wherein the one or more second protrusions surround the first protrusion in a plan view of the light emitting display apparatus.

27. The light emitting display apparatus of claim 24, wherein the one or more second protrusions comprise a plurality of protrusions each having a different height.

28. The light emitting display apparatus of claim 24, wherein the one or more second protrusions comprise a plurality of protrusions that have a same height.

* * * * *